(12) United States Patent  (10) Patent No.: US 9,155,228 B2
Hill  (45) Date of Patent: Oct. 6, 2015

(54) EQUIPMENT CABINET WITH A VENTILATION SYSTEM

(75) Inventor: Dennis Mason Hill, Wellington (NZ)

(73) Assignee: RAYHILL LIMITED, Wellington (NZ)

( * ) Notice: Subject to any disclaimer, the term of this patent is extended or adjusted under 35 U.S.C. 154(b) by 1443 days.

(21) Appl. No.: 12/517,061

(22) PCT Filed: Nov. 23, 2007

(86) PCT No.: PCT/NZ2007/000346
§ 371 (c)(1),
(2), (4) Date: Mar. 12, 2010

(87) PCT Pub. No.: WO2008/066395
PCT Pub. Date: Jun. 5, 2008

(65) Prior Publication Data
US 2010/0171400 A1  Jul. 8, 2010

(30) Foreign Application Priority Data
Dec. 1, 2006 (NZ) ........................... 551765

(51) Int. Cl.
*H05K 7/20* (2006.01)
(52) U.S. Cl.
CPC .................... *H05K 7/20618* (2013.01)
(58) Field of Classification Search
CPC ....................................... H05K 7/20
USPC ........................................... 454/184
See application file for complete search history.

(56) References Cited

U.S. PATENT DOCUMENTS 2,642,860 A * 6/1953 Hunter et al. ................. 126/281
2,960,844 A * 11/1960 Quick ............................. 62/150
3,094,851 A * 6/1963 Beckwith ........................ 62/256
3,122,892 A * 3/1964 Beckwith .......................... 62/81
3,134,243 A * 5/1964 Hagen et al. .................... 62/256
5,040,095 A 8/1991 Beaty et al.
(Continued)

FOREIGN PATENT DOCUMENTS

WO WO 00/56134 A2 9/2000
WO WO 01/15507 3/2001

OTHER PUBLICATIONS

International Search Report for PCT Counterpart Application No. PCT/NZ2007/000346, 3 pgs (Apr. 21, 2008).
(Continued)

*Primary Examiner* — Steven B McAllister
*Assistant Examiner* — Samantha Miller
(74) *Attorney, Agent, or Firm* — Novak Druce Connolly Bove + Quigg LLP

(57) ABSTRACT

An equipment cabinet (1) has a first compartment (3), a second compartment (5), and a ventilation system. The first compartment (3) may be an inner or electronic compartment and the second compartment (5) may be an outer or battery compartment. The ventilation system has at least one operating configuration which enables air to flow from outside the second compartment to the first compartment then to the second compartment, and which enables little or no air to flow from the second compartment to the first compartment. The ventilation system has another operating configuration in which little or no air can flow from outside the second compartment to the first compartment, little or no air can flow from the second compartment to the first compartment, and air is able to substantially recirculate through or in the first compartment.

9 Claims, 5 Drawing Sheets

(56) References Cited

U.S. PATENT DOCUMENTS

| | | | |
|---|---|---|---|
| 5,559,673 A * | 9/1996 | Gagnon et al. | 361/695 |
| 5,832,988 A * | 11/1998 | Mistry et al. | 165/103 |
| 6,015,288 A * | 1/2000 | Mundon | 432/212 |
| 6,021,709 A * | 2/2000 | Koopman et al. | 99/476 |
| 6,123,266 A * | 9/2000 | Bainbridge et al. | 236/49.3 |
| 6,201,694 B1 * | 3/2001 | Turunen | 361/695 |
| 6,598,668 B1 * | 7/2003 | Cosley et al. | 165/104.32 |
| 6,651,446 B1 | 11/2003 | Woods | |
| 6,678,156 B2 * | 1/2004 | Moizer | 361/690 |
| 6,742,583 B2 * | 6/2004 | Tikka | 165/291 |
| 6,834,715 B2 | 12/2004 | Garcia et al. | |
| 6,889,752 B2 * | 5/2005 | Stoller | 165/47 |
| 6,896,612 B1 * | 5/2005 | Novotny | 454/184 |
| 7,675,750 B1 * | 3/2010 | Tamarkin | 361/695 |
| 7,788,940 B2 * | 9/2010 | Madara et al. | 62/259.2 |
| 7,869,210 B2 * | 1/2011 | Moss | 361/694 |
| 7,957,139 B2 * | 6/2011 | Davis et al. | 361/690 |
| 2004/0007347 A1 * | 1/2004 | Stoller | 165/47 |
| 2004/0007348 A1 * | 1/2004 | Stoller | 165/47 |
| 2004/0217072 A1 * | 11/2004 | Bash et al. | 211/26 |
| 2008/0316703 A1 * | 12/2008 | Donowho et al. | 361/695 |

OTHER PUBLICATIONS

Written Opinion of the International Search Authority for PCT Counterpart Application No. PCT/NZ2007/00346, 4 pgs (Apr. 21, 2008).

* cited by examiner

EQUIPMENT CABINET WITH A VENTILATION SYSTEM

CROSS-REFERENCE TO RELATED APPLICATIONS

This patent application is a U.S. National Phase application under 35 U.S.C. §371 of International Application No. PCT/NZ2007/000346, filed on Nov. 23, 2007, entitled EQUIPMENT CABINET WITH A VENTILATION SYSTEM, which claims priority to New Zealand patent application number 551765, filed Dec. 1, 2006.

FIELD OF INVENTION

The invention relates equipment cabinets for housing electronic equipment.

BACKGROUND

Electronic equipment for many functions is housed in cabinets. Such equipment may be equipment for airport runways, traffic lights, remote cellular sites, weather tracking sites and light houses. Equipment cabinets, in both central and remote locations must be maintained within a temperature range that allows the electronics inside the cabinet to function. If the temperature inside the cabinet becomes too high or too low the equipment may malfunction or cease to function altogether.

Some equipment is housed in cabinets in remote locations that may be hard to access and maintain. Remote locations may also be in a harsh environment that may be subject to temperature extremes. In these circumstances the equipment inside the cabinets must be protected from low temperatures as well as from high temperatures.

Current systems for providing ventilation for equipment cabinets may include a separate ventilation chamber attached to the cabinet. Air circulates in the ventilation chamber altering the air temperature inside the cabinet. A disadvantage of this system is that the cabinet does not experience any change in air.

Equipment cabinets may house batteries as a primary or back up source of power for the electronic equipment. Gases, for example hydrogen, may be released from the batteries during use or when they are overcharged. The gases have a corrosive effect on the electronic equipment that may cause the equipment to malfunction.

It is an object of at least preferred embodiments of the present invention to provide an improved equipment cabinet, or to at least provide the public with a useful choice.

SUMMARY OF INVENTION

In a first aspect, the invention broadly consists in an equipment cabinet comprising:
- an inner compartment;
- an outer compartment enclosing the inner compartment; and
- a ventilation system having at least one operating configuration which enables air to flow from outside the outer compartment to the inner compartment then to the outer compartment, and enables little or no air to flow from the outer compartment to the inner compartment.

The term "comprising" as used in this specification and claims means "consisting at least in part of", that is to say when interpreting statements in this specification and claims which include that term, the features prefaced by that term in each statement all need to be present but other features can also be present. Related terms such as "comprise" and "comprised" are to be interpreted in similar manner.

Preferably, the ventilation system has multiple operating configurations, wherein in another of the operating configurations little or no air can flow from outside the outer compartment to the inner compartment, little or no air can flow from the outer compartment to the inner compartment, and air is able to substantially recirculate through or in the inner compartment.

Preferably, the equipment cabinet further comprises a fan to substantially recirculate air through or in the inner compartment in said another of the operating configurations.

Preferably, the ventilation system comprises a selective closure having an open configuration in which air can flow from outside the outer compartment to the inner compartment and a closed position in which little or no air can flow from outside the outer compartment to the inner compartment.

Preferably, the selective closure is positioned within the inner compartment.

Preferably, the equipment cabinet further comprises a controller to control the selective closure.

Preferably, the ventilation system comprises a first duct defining an air flow path from outside the outer compartment to the inner compartment.

Preferably, the first duct has an inlet in fluid communication with an inlet port in a wall of the outer compartment and an outlet in fluid communication with an inlet port in a wall of the inner compartment.

In one embodiment, the equipment cabinet further comprises a second duct defining an air flow path from the inner compartment to the outer compartment. In this embodiment, the second duct may have an inlet in fluid communication with an outlet port in a wall of the inner compartment and an outlet positioned in a lower region of the outer compartment.

In another embodiment, the equipment cabinet further comprises a recirculating duct defining an air flow path from an outlet port of the inner compartment to the inlet port of the inner compartment.

Preferably, the outlet port of the outer compartment is positioned at or toward the top of the outer cabinet.

Preferably, the inner compartment is positioned in an upper region of the outer compartment, and a lower region of the outer compartment is free to house equipment.

Preferably, the inner compartment is adapted to contain electronic equipment and the outer cabinet is adapted to contain at least one battery.

In a second aspect, the invention broadly consists in an equipment cabinet as outlined in relation to the first aspect above, when used to house at least one battery in the outer compartment and at least one item of electronic equipment in the inner compartment.

In a third aspect, the invention broadly consists in an equipment cabinet comprising:
- an electronics compartment adapted to contain electronic equipment;
- a battery compartment adapted to contain at least one battery; and
- a ventilation system having at least one operating configuration which enables air to flow from outside the equipment cabinet to the electronics compartment then to the battery compartment, and enables little or no air to flow from the battery compartment to the electronics compartment.

The second aspect may include any one or more features of the first aspect above.

In a fourth aspect, the invention broadly consists in an equipment cabinet as outlined in relation to the third aspect above, when used to house at least one battery in the battery compartment and at least one item of electronic equipment in the electronics compartment.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting. Where specific integers are mentioned herein which have known equivalents in the art to which this invention relates, such known equivalents are deemed to be incorporated herein as if individually set forth.

The invention consists in the foregoing and also envisages constructions of which the following gives examples only.

BRIEF DESCRIPTION OF DRAWINGS

The present invention will now be described with reference to the accompanying drawings in which.

DETAILED DESCRIPTION

Figure 1:
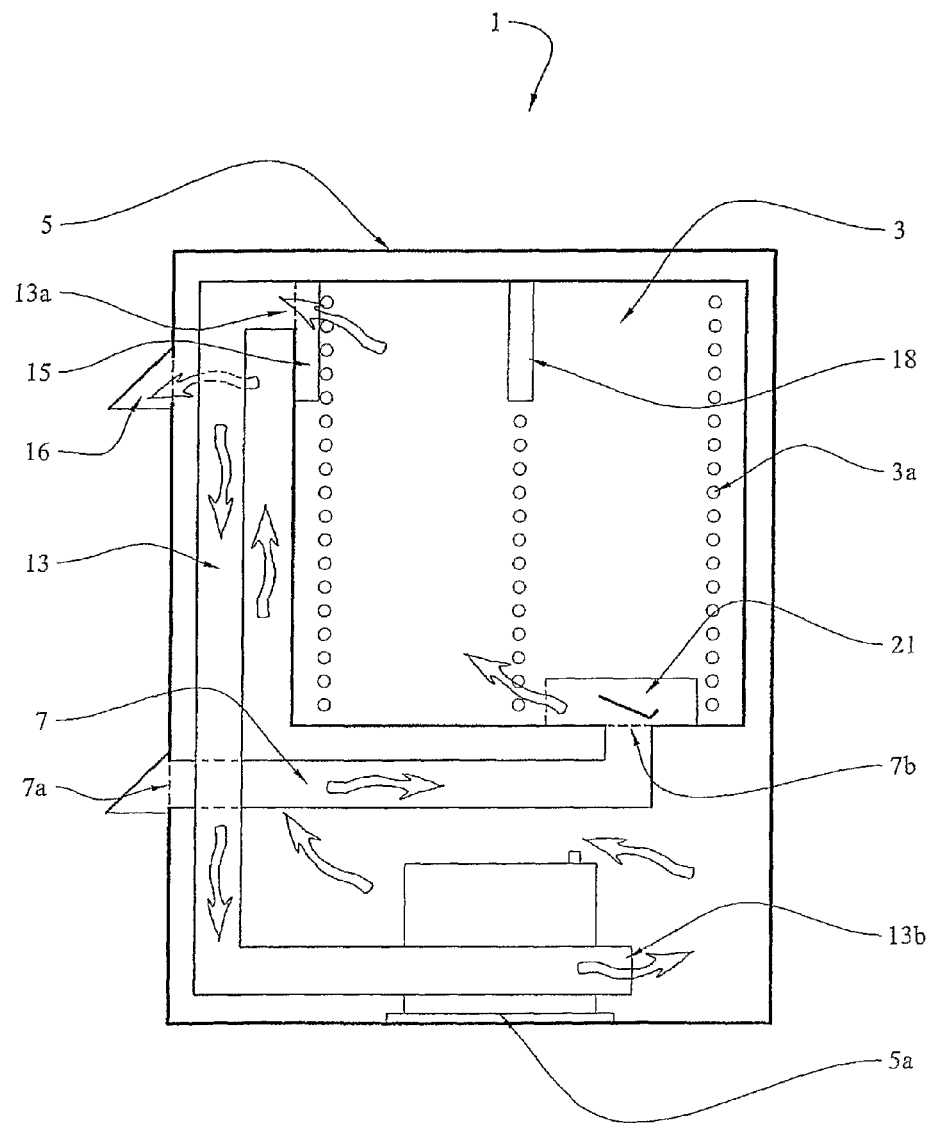
FIG. 1 shows a schematic front view of a first preferred embodiment of the equipment cabinet with the front panels of the inner and outer cabinets removed.

FIG. 1 shows a first preferred embodiment of the equipment cabinet indicated generally by reference numeral 1. In the form shown, the cabinet has an inner compartment 3, an outer compartment 5, and a ventilation system for circulating air. FIG. 1 shows the equipment cabinet with the front panel of the inner compartment and the front panel of the outer compartment removed. A single front panel may close and seal off the inner and outer compartments.

The embodiment shown is for use with outdoor telecommunication equipment at remote sites. The inner compartment 3 is an electronics compartment having one or more electronic mounts 3a to receive and support various electronic components (not shown). The electronic components may be assembled with the cabinet during manufacture of the cabinet, or may be assembled at the remote site.

The outer compartment 5 surrounds the inner compartment 3 and is a battery compartment having one or more battery mounts 5a to receive and support one or more batteries 4. In the form shown, the battery mount is a battery tray. When assembled, the inner compartment is positioned in an upper region of the outer compartment, with the batteries positioned below the inner compartment in a lower region of the outer compartment. The batteries may be assembled with the cabinet during manufacture of the cabinet, or may be assembled on site.

The outer compartment 5 is insulated to assist in maintaining the temperature within a required temperature range. The insulation also reduces the amount of noise that escapes from the cabinet.

The ventilation system has an air flow path with an inlet section that enables air to flow from outside the outer compartment and thereby the outside of the equipment cabinet to the inner compartment, and an outlet section that enables air to flow from inside the inner compartment, through the outer compartment, to outside the outer compartment and thereby outside the equipment cabinet. The air flow follows a general path shown with arrows in FIG. 1. The fresh air flows from outside the outer compartment to the inner compartment 3 along a first duct or inlet 7. The first duct has an inlet 7a and an outlet 7b. The inlet 7a is in fluid communication with an inlet port in the side wall of the outer compartment, and the outlet 7b is in fluid communication with an inlet port in the base wall of the inner compartment. The outlet 7b of the first duct introduces fresh air to the inner compartment 3, suitably at the base of the inner compartment. The air is circulated through the inner compartment 3 by natural or forced convection, for example by fan 15, and exits the inner compartment through a second duct 13.

The second duct 13 leads the air from the inner compartment 3 to a lower region of the outer compartment 5. The second duct has an inlet 13a and an outlet 13b. The inlet 13a of the second duct is in fluid communication with an outlet port in the side wall of the inner compartment, and the outlet 13b of the second duct is located within the outer compartment toward the base of the outer compartment. The outlet 13b of the second duct introduces air to the outer compartment 5 at the base of the outer compartment.

The air is circulated within the outer compartment 5 by natural or forced convection, for example by a fan (not shown), and exits from the outer compartment through an outlet port 16 that is positioned at or toward the top of the outer compartment. This represents a first operating configuration of the ventilation system.

As hydrogen is lighter than air, any hydrogen produced by the batteries will rise to the top of the outer compartment and exit the outer compartment through the outlet port 16, and will be assisted in that movement by the air exiting the inner compartment. The electronic equipment is fully enclosed by the inner compartment and is sealed from the outer compartment other than via the duct 13. Due to the tortuous path of the duct 13, little or no air can flow from the outer compartment to the inner compartment. Additionally, when fan 15 is operating to deliver air into duct 13, air will not be able to travel up the duct 13 into the inner compartment. In some embodiments, a selective closure may be provided over the outlet port, of the inner compartment or elsewhere in the duct 13 to selectively seal the inner compartment from the outer compartment.

In the embodiment shown, the inlet port and outlet port of the outer compartment are provided on the same side of the outer compartment. This enables the cabinet to be positioned and oriented so the inlet and outlet ports of the outer compartment face in a direction away from the prevailing wind direction for a remote site. The inlet and outlet ports will generally be provided with filters.

The air path may be closed by a selective closure 21. The selective closure has an open configuration in which air may flow into the inner chamber from the inlet duct and a closed configuration in which little or no air can flow into the inner compartment from the inlet duct.

In the embodiment shown, the selective closure is positioned within the inner compartment at the bottom of the inner compartment, over the outlet 7b of the first duct and inlet port of the inner compartment. The configuration of the closure is generally controlled by a controller, although it could be controlled by airflow upon operation of one or more fans. In one embodiment the controller is a solenoid 23, although any suitable controller may be used.

The closure 21 has a housing 25 and a flap 27 that pivots via a pin 29 extending through the housing. Attached to the flap 27 is a member 31 that forms a connection between the flap and the solenoid 23, allowing the solenoid to open and close the flap 27 by moving the flap. The closure also includes micro-switch (not shown) that provides an indication of whether the closure is open or closed. The micro-switch can be remotely monitored so that the opening and closing of closure can be tracked. The micro-switch can also be used to operate a fan inside the cabinet.

As can be seen from the arrows in FIG. 1, in the first operating configuration of the ventilation system when the closure 21 is open, air circulates along the air flow path from outside the outer compartment 5 through the first duct to the inner compartment 3, then through the second duct to the outer compartment and out through the outlet port to the outside of the cabinet.

Figure 2:
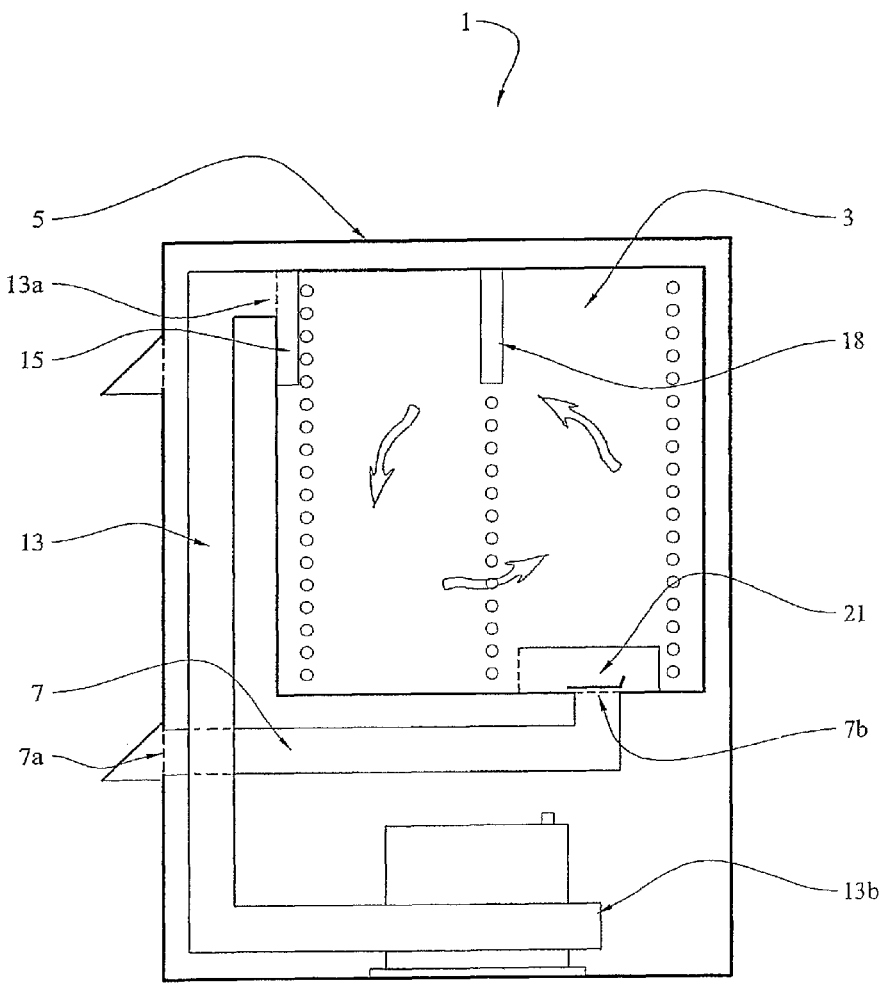
FIG. 2 shows a schematic front view of the equipment cabinet of FIG. 1 showing the air flow path when the selective closure is in a closed position.
Figure 3:
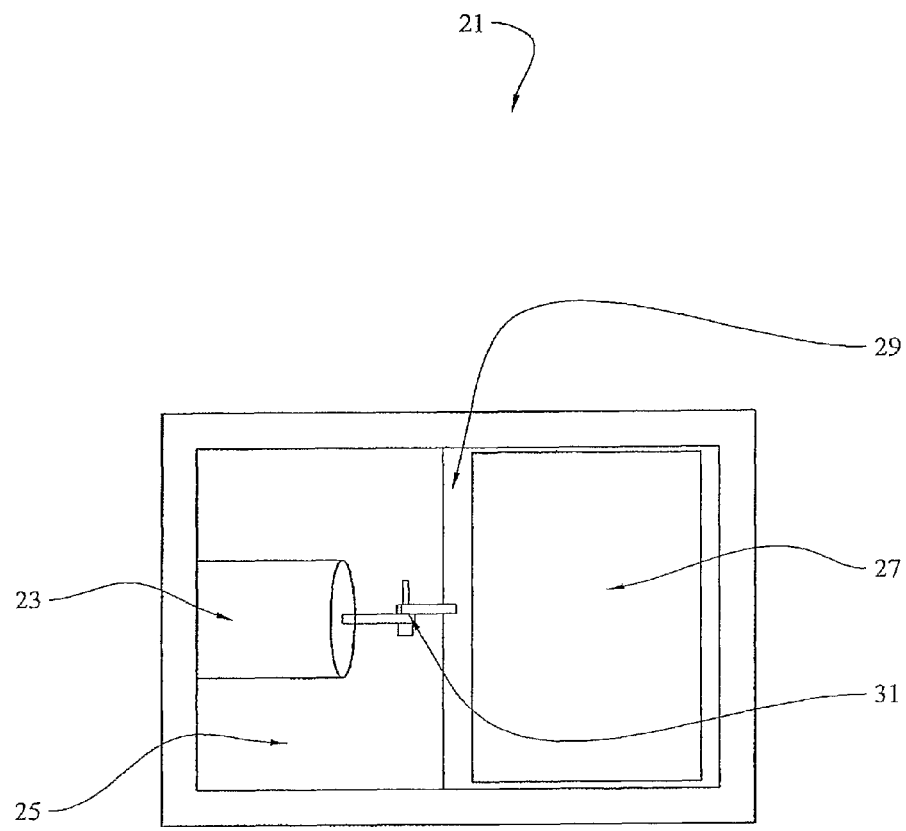
FIG. 3 shows a schematic view from below of the selective closure of the first embodiment.

FIG. 2 shows the preferred embodiment cabinet of the invention with the closure closed; that is when the ventilation system is in a second operating configuration. When the closure is closed, air substantially recirculates within the inner housing and little or no air can flow along the air flow path from the inlet port of the outer compartment and the inlet port of the inner compartment. A supplementary fan 18 may be operated in that configuration to cause the recirculation. Due to the tortuous path of the duct 13 and the closure 21 being closed, there will be little or no transfer of air to or from the inner compartment and the outer compartment. If a closure is provided over the outlet duct in the inner compartment, that would be closed in this operating configuration.

In preferred embodiments, the equipment cabinet includes at least one temperature sensor not shown). The controller receives an indication of when the temperature of the inner compartment is outside a predetermined operating range as sensed by the temperature sensor.

If the temperature falls outside the predetermined operating range, the controller operates the closure. For example, if the internal temperature of the inner compartment rises above the upper limit of the operating range the temperature sensor sends an indication to controller, and the controller opens the closure to allow more fresh air to circulate along the air flow path to cool the electronic components.

If the temperature within the inner compartment falls below the lower limit of the operating range, the temperature sensor sends an indication to the controller, and the controller closes the closure to prevent fresh air from circulating along the air flow path.

In one embodiment, the equipment cabinet includes a fan provided in the inner electronics compartment. The equipment housing may include a further fan positioned in the outer battery compartment. Either fan may be controlled by a temperature sensor inside the cabinet to assist in air circulation. One or more fans could be positioned in or adjacent to one or more of the ducts.

If the cabinet and air circulation and ventilation unit is housed in an area that experiences very cold temperatures, the air circulation and ventilation unit may include a heater (not shown). For example, the inner cabinet may have a heater to heat the inner cabinet if the temperature inside the cabinet falls below a predetermined lower limit. In one embodiment, the heater is controlled by a temperature sensor inside the cabinet. The heater may be provided in the battery compartment to assist in maintaining the battery at a desired temperature.

The controller may respond to information from temperature sensor(s) and/or to an indication of the load on the components. For example if the component load is high the amount of heat generated by the components will be greater than when the component load is low so the closure may be opened during periods of high component load. In an alternative embodiment the controller may open and close the closure based on the time of clay and the day of the year. The controller may also respond to a condensation indication so as to reduce condensation within the cabinet. In one embodiment, the controller is a thermostatically controlled solenoid. In an alternative embodiment, the controller may include a microprocessor or the like and receive temperature indications from the temperature sensor(s). The controller may then open or close the closure in response to temperature or other indications. In this embodiment the controller may also control any fans or heaters and these can be controlled independently of the closure.

In one embodiment the temperature sensor is inside the inner compartment. Alternatively the temperature sensor can be in the outer compartment. In a further alternative embodiment, a temperature sensor is positioned outside the cabinet to provide an indication of the outside air temperature.

As an equipment protection mechanism in the event of a power failure the solenoid is arranged to operate the closure to open the closure so that the equipment inside the cabinet does not over heat. In extreme cold environments the solenoid may be arranged to close the closure in the event of a power failure.

The equipment that is housed in the inner compartment is powered by one or more batteries housed in the outer compartment. The batteries will be 12 volt or 24 volt batteries, or of any other suitable voltage to power the equipment. The batteries may be recharged by a renewable source of energy such as one or more solar cells. Alternatively, the batteries may be recharged by a mains electricity source. The battery or batteries will be in electrical connection with the electronics components via suitable leads or the like. The batteries will be recharged via a battery charger that is powered by the mains electricity source or solar cell. The battery charger may be provided in the inner compartment or outer compartment, but will generally be provided in the inner compartment so as to be substantially isolated from any hydrogen that is released by the battery. The electronics will be selected to operate at the output voltage of the battery.

Figure 4:
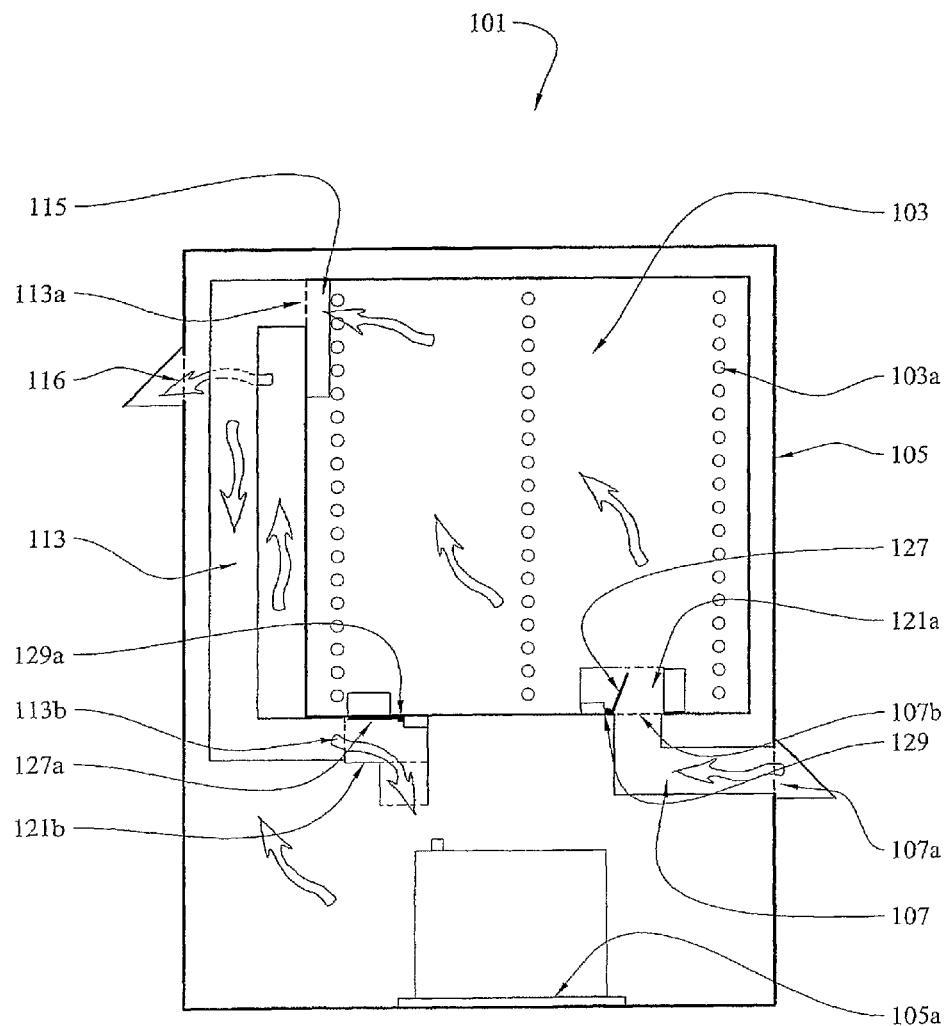
FIG. 4 shows a schematic front view of a second preferred embodiment equipment cabinet showing the air flow path of a first operating configuration.

FIG. 4 shows a second preferred embodiment of the equipment cabinet indicated generally by reference numeral 101. In the form shown, the cabinet has an inner compartment 103, an outer compartment 105, and a ventilation system for circulating air. FIG. 4 shows the equipment cabinet with the front panel of the inner compartment and the front panel of the outer compartment removed. Unless described below, the features and operation should be considered to be the same as those described above and like numerals are used to indicate like parts, with the addition of 100.

The ventilation system has an air flow path with an inlet section that enables air to flow from outside the outer compartment to the inner compartment, and an outlet section that enables air to flow from inside the inner compartment, through the outer compartment, to outside the outer compartment. In the second embodiment, the ventilation system also has an air flow path that selectively allows air to recirculate from the outlet of the inner compartment to an inlet of the inner compartment, and thereby through the inner compartment.

In a first operating configuration of the ventilation system, the air flow follows a general path shown with arrows in FIG. 4. The fresh air flows from outside the outer compartment to the inner compartment 103 along a first duct 107. The first duct has an inlet 107a and an outlet 107b. The inlet 107a is in fluid communication with an inlet port in the side wall of the outer compartment, and the outlet 107b is in fluid communication with an inlet port of the inner compartment, suitably in the base wall of the inner compartment. The outlet 107b of the first duct introduces fresh air to the inner compartment 103. The air is circulated through the inner compartment 103 by natural or forced convection, for example by fan 115, and exits the inner compartment through a second or recirculating duct 113.

The second duct has an inlet 113a and an outlet 113b. The inlet of the second duct is in fluid communication with an outlet port in the side wall of the inner compartment, and the outlet of the second duct is located toward the base of the inner compartment. The outlet 113b of the second duct delivers air from the inner compartment 103 to the lower region of the outer compartment.

Figure 5:
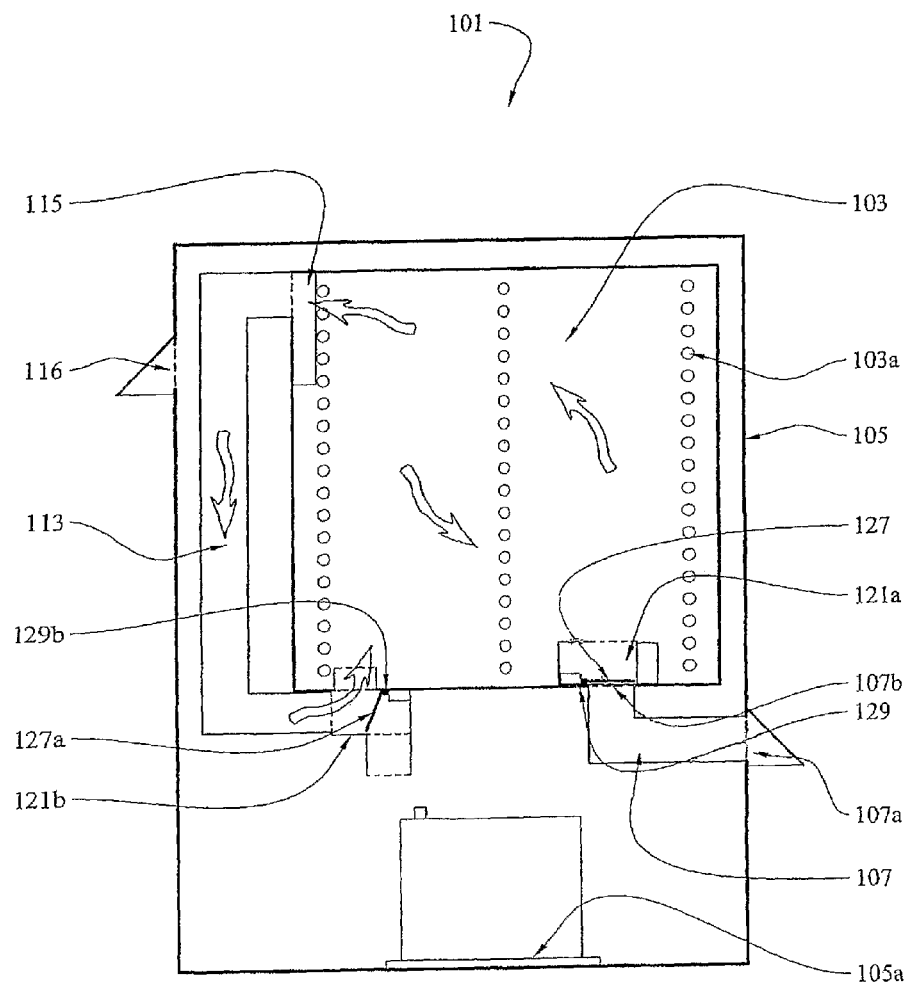
FIG. 5 shows a schematic view of the equipment cabinet of FIG. 4 showing the air flow path of a second operating configuration.

The air path may be closed by two selective closures 121a, 121b. The first selective closure 121a has an open configuration (FIG. 4) in which air may flow into the inner chamber from the inlet duct and a closed configuration (FIG. 5) in which little or no air can flow into the inner chamber from the inlet duct. In the form shown, the first selective closure 121a is positioned on an outer wall of the inner compartment and the second selective closure is positioned on an outer wall of the inner compartment. However, that could vary. The second selective closure controls the air flow exiting the outlet of the second duct. In the open configuration (FIG. 4), the second selective closure allows air to flow into the outer compartment from the second duct. In the closed configuration (FIG. 5), little or no air can flow into the outer chamber from the second duct, and is instead substantially recirculated through the inner compartment. That configuration is shown in FIG. 5, and represents a second operating configuration of the ventilation system.

Each selective closure is generally controlled by a controller. In one embodiment each controller is a solenoid, although any suitable controller may be used.

The first closure 121 has a housing 125, a first flap 127 that pivots via a first pin 129 extending through the housing. Similarly, the second closure has a second flap 127a that pivots via a second pin 129a. The first flap controls flow of fresh air into the inner compartment. When the first flap is open, fresh air can flow into the inner compartment from outside the cabinet. When the first flap is closed, little or no air can flow into the inner compartment from outside the cabinet.

The second flap is opened and closed by a second solenoid. The second flap pivots between an open position and a closed position. In the open position, air can flow from the outlet of the second duct to the outer compartment. That represents the first operating configuration of the ventilation system. In the closed position, air can flow from the outlet of the second duct to an inlet port of the inner compartment. This represents the second operating configuration of the ventilation system.

Each closure also includes one or more micro-switches (not shown) that provide an indication of whether the closure is open or closed. The micro-switches can be remotely monitored so that the opening and closing of closure can be tracked. The micro-switches can also be used to operate a fan inside the cabinet.

As can be seen from the arrows in FIG. 4, in the first operating configuration of the ventilation system, air circulates along the air flow path from outside the outer compartment 105 through the first duct to the inner compartment 103, then through the second duct and second selective closure to the outer compartment, and out through the outlet port 116 to the outside of the cabinet. FIG. 5 shows the second preferred embodiment cabinet of the invention with the closures closed; that is when the ventilation system is in a second operating configuration. When the closures are closed, air substantially recirculates through the inner housing and the second duct, and little or no air flows into the outer compartment. In both the first and second operating configurations, the air is circulated through the inner compartment 103 by natural or forced convection, for example by fan 115.

Again, compartment 103 is an electronics compartment and compartment 105 is a battery compartment.

The foregoing describes the invention including preferred forms thereof. Alterations and modifications as will be obvious to those skilled in the art are intended to be incorporated in the scope hereof as defined by the accompanying claims.

For example, the equipment cabinet has been described for use with outdoor telecommunication equipment. However, it will be appreciated that the equipment cabinet may be used for housing electronics equipment for airport runways, traffic lights, remote cellular sites, weather tracking sites, and light houses.

The selective closures have been described as having a housing and a pivotable flap (or two pivotable flaps in the case of the second embodiment). Alternatively, the selective closure(s) may be any other suitable flow control device(s), for example a butterfly valve or a gate valve.

Where single components such as inlet ports, outlet ports, and ducts have been described, it will be appreciated that multiple components could instead be used.

What is claimed is:

1. An equipment cabinet comprising
a closed inner compartment including an interior of the closed inner compartment, mounts for supporting electronic components in the interior of the closed inner compartment, an inlet port to the interior of the closed inner compartment below the mounts and an outlet port from the interior of the closed inner compartment above and displaced from the inlet port;
an insulated closed outer compartment including an interior of the closed outer compartment and an exhaust port from the interior of the closed outer compartment to outside of the outer compartment, the closed inner compartment being surrounded fully by the closed outer compartment;
a first duct extending from outside of the outer compartment through the interior of the outer compartment to the inlet port of the closed inner compartment for directed flow from outside to the interior of the closed inner compartment;
a second duct extending within the interior of the closed outer compartment from the outlet port of the closed inner compartment to within the outer compartment below the inner compartment for directed flow from the interior of the closed inner compartment to the interior of the closed outer compartment below the inner compartment toward a battery position;
an inlet selective closure in communication with the first duct having an open configuration allowing flow through the first duct and a closed configuration preventing flow through the first duct;
an outlet fan positioned to induce flow from outside the outer compartment through the first duct, the interior of the inner compartment, the second duct and the exhaust port in seriatim with the inlet selective closure in the open position;

a circulation fan in the interior of the inner compartment to induce circulation within the interior of the inner compartment with the selective closure in the closed configuration.

2. The equipment cabinet of claim 1 further comprising
a battery in the interior of the outer compartment below the inner compartment, the directed flow from the second duct being about the battery and to the exhaust port from the closed outer compartment in seriatim.

3. The equipment cabinet of claim 1, the first duct extending from outside the outer compartment lower than and displaced from the exhaust port.

4. The equipment cabinet of claim 1 further comprising
an outlet selective closure in communication with the second duct having a recirculating configuration allowing flow between the second duct and the interior of the inner compartment below the mounts and an exhaust configuration allowing flow between the second duct and the exhaust port.

5. The equipment cabinet of claim 4 further comprising
a battery in the interior of the outer compartment below the inner compartment, the directed flow from the second duct being about the battery and to the exhaust port from the closed outer compartment in seriatim.

6. The equipment cabinet of claim 4, the first duct extending from outside the outer compartment lower than and displaced from the exhaust port.

7. An equipment cabinet comprising
a closed inner compartment including an interior of the closed inner compartment, mounts for supporting electronic components in the interior of the closed inner compartment, an inlet port to the interior of the closed inner compartment below the mounts and an outlet port from the interior of the closed inner compartment above and displaced from the inlet port;
an insulated closed outer compartment including an interior of the closed outer compartment and an exhaust port from the interior of the closed outer compartment to outside of the outer compartment, the closed inner compartment being surrounded fully by the closed outer compartment;
a first duct extending from outside of the outer compartment through the interior of the outer compartment to the inlet port of the closed inner compartment for directed flow from outside to the interior of the closed inner compartment;
a second duct extending within the interior of the closed outer compartment from the outlet port of the closed inner compartment to within the outer compartment below the inner compartment for directed flow from the interior of the closed inner compartment to the interior of the closed outer compartment below the inner compartment toward a battery position and the exhaust port, the second duct being in communication with the exhaust port;
an inlet selective closure in communication with the first duct having an open configuration allowing flow through the first duct and a closed configuration preventing flow through the first duct;
an outlet fan positioned to induce flow from outside the outer compartment through the first duct, the interior of the inner compartment, the second duct and the exhaust port in seriatim with the inlet selective closure in the open configuration;
a circulation fan in the interior of the inner compartment to induce circulation within the interior of the inner compartment with the selective closure in the closed configuration.

8. An equipment cabinet comprising
a closed inner compartment including an interior of the closed inner compartment, mounts for supporting electronic components in the interior of the closed inner compartment, an inlet port to the interior of the closed inner compartment below the mounts and an outlet port from the interior of the closed inner compartment above and displaced from the inlet port;
an insulated closed outer compartment including an interior of the closed outer compartment and an exhaust port from the interior of the closed outer compartment to outside of the outer compartment, the closed inner compartment being surrounded fully by the closed outer compartment;
a first duct extending from outside of the outer compartment through the interior of the outer compartment to the inlet port of the closed inner compartment for directed flow from outside to the interior of the closed inner compartment;
a second duct extending within the interior of the closed outer compartment from the outlet port of the closed inner compartment to within the outer compartment below the inner compartment for directed flow from the interior of the closed inner compartment to the interior of the closed outer compartment below the inner compartment toward a battery position, the second duct being in communication with the exhaust port;
an inlet selective closure in communication with the first duct having an open configuration allowing flow through the first duct and a closed configuration preventing flow through the first duct;
a fan positioned to induce flow from outside the outer compartment through the first duct, the interior of the inner compartment, the second duct and the exhaust port in seriatim with the inlet selective closure in the open configuration;
an outlet selective closure in communication with the second duct having a recirculating configuration allowing flow between the second duct and the interior of the inner compartment below the mounts and an exhaust configuration allowing flow between the second duct and the exhaust port through the interior of the closed outer compartment.

9. An equipment cabinet comprising
a closed inner compartment including an interior of the closed inner compartment, mounts for supporting electronic components in the interior of the closed inner compartment, an inlet port to the interior of the closed inner compartment below the mounts and an outlet port from the interior of the closed inner compartment above and displaced from the inlet port;
an insulated closed outer compartment including an interior of the closed outer compartment and an exhaust port from the interior of the closed outer compartment to outside of the outer compartment, the closed inner compartment being surrounded fully by the closed outer compartment;
a first duct extending from outside of the outer compartment through the interior of the outer compartment to the inlet port of the closed inner compartment for directed flow from outside to the interior of the closed inner compartment;

a second duct extending within the interior of the closed outer compartment from the outlet port of the closed inner compartment to within the outer compartment below the inner compartment for directed flow from the interior of the closed inner compartment to the interior of the closed outer compartment below the inner compartment toward a battery position;

a fan positioned to induce flow from outside the outer compartment through the first duct, the interior of the inner compartment, the second duct and the exhaust port in seriatim with the inlet selective closure in the open configuration;

an outlet selective closure in communication with the second duct having a recirculating configuration allowing flow between the second duct and the interior of the inner compartment below the mounts and an exhaust configuration allowing flow between the second duct and the exhaust port through the interior of the closed outer compartment.

* * * * *